United States Patent [19]

O'Donnell

[11] Patent Number: 5,566,207
[45] Date of Patent: * Oct. 15, 1996

[54] DIGITAL FM SYNTHESIZER FOR RECORD CIRCUITRY

[75] Inventor: Eugene M. O'Donnell, Indianapolis, Ind.

[73] Assignee: Thomson Consumer Electronics, Inc., Indianapolis, Ind.

[*] Notice: The portion of the term of this patent subsequent to Feb. 14, 2012, has been disclaimed.

[21] Appl. No.: 387,671

[22] Filed: Feb. 13, 1995

Related U.S. Application Data

[63] Continuation of Ser. No. 927,512, filed as PCT/US91/03811, Jun. 30, 1991, Pat. No. 5,390,213.

[30] Foreign Application Priority Data

Jun. 1, 1990 [GB] United Kingdom .................... 9012327

[51] Int. Cl.⁶ ...................................................... H03K 7/08
[52] U.S. Cl. .............................. 375/239; 370/10; 332/112
[58] Field of Search ...................................... 375/238, 239, 375/353; 370/8–10; 360/27, 29–30, 32; 340/825.63, 825.64; 332/106, 109, 112

[56] References Cited

U.S. PATENT DOCUMENTS

| | | | |
|---|---|---|---|
| 4,051,539 | 9/1977 | Geddes et al. ................................ | 370/9 |
| 4,181,817 | 1/1980 | Gallo ........................................ | 375/242 |
| 4,906,942 | 3/1990 | Nakai et al. .............................. | 329/318 |
| 4,912,524 | 3/1990 | Nakamura et al. ...................... | 375/242 |

FOREIGN PATENT DOCUMENTS

| | | |
|---|---|---|
| 0068535 | 1/1983 | European Pat. Off. . |
| 0078588 | 1/1983 | European Pat. Off. . |
| 3740130 | 6/1989 | Germany . |

OTHER PUBLICATIONS

IEEE Transactions on Consumer Electronics, Digital Signal Processing in Video Tape Recorders, Sanke Mehrgardt, vol. CE-31, No. 3, Aug. 1985, pp. 374–377.

IEEE Transactions on Consummer Electronics, Experiments on VTR Digital Signal Processing, Kaoru Kobayashi, vol. CE-32, No. 3, Aug. 1986, pp. 355–361.

*Primary Examiner*—Young T. Tse
*Attorney, Agent, or Firm*—Joseph S. Tripoli; Joseph J. Laks; Daniel E. Sragow

[57] ABSTRACT

A digital synthesizer for record circuitry of, e.g., a VCR, is supplied with digital samples representing a video signal. A calculator stage, responsive to the digital samples calculates a sequence of pulse periods defining a pulse duration modulated signal that represents FM modulation of a carrier by the video signal. An output sample generating stage operates on the sequence of pulse periods for generating a sequence of digital output samples which is converted in a digital-to-analog converter to the FM modulated video signal for subsequent recording on tape.

22 Claims, 4 Drawing Sheets

DIGITAL FM SYNTHESIZER FOR RECORD CIRCUITRY

This is a continuation of application Ser. No. 927,512, filed as PCT/US91/03811, Jun. 30, 1991, now U.S. Pat. No. 5,390,213.

This invention relates to digital FM recording of a signal, such as the digital recording of an FM video signal

BACKGROUND

Analog generation of an FM video signal for recording presents various problems, including aging of components, tolerances in the circuitry generating the carrier and the carrier deviation, and pre-emphasis circuitry which vary significantly from the nominal. Digital FM modulating techniques have, heretofore, been cumbersome requiring the use of a substantial amount of circuitry and excessive memory storage.

A feature of the invention is a digital synthesizer technique and system which avoids the disadvantages of analog modulation, without introducing the complexity of typical digital signal processing.

SUMMARY

A digital synthesizer generates a sequence of digital output samples representing modulation of a carrier by an input signal. The synthesizer is supplied with digital input samples representing the input signal. A calculator stage, responsive to the digital input samples calculates a sequence of pulse periods defining a pulse duration modulated signal that represents the modulation of the carrier by the input signal. An output sample generating stage operates on the sequence of pulse periods for generating the sequence of digital output samples representing the carrier modulated output signal.

DESCRIPTION OF THE INVENTION

In an FM modulated system, the FM modulated output signal, FM(t), may be defined as $$FM(t) = \sin\{2\pi * Freq(t)t\} \quad \text{Eq. (1),}$$

where an instantaneous frequency, Freq(t), may be defined by $$Freq(t) = CAR + DEV * M(t) \quad \text{Eq. (2),}$$

where M(t) is the modulating signal, CAR is the carrier frequency, and DEV is the deviation.

Figure 1:
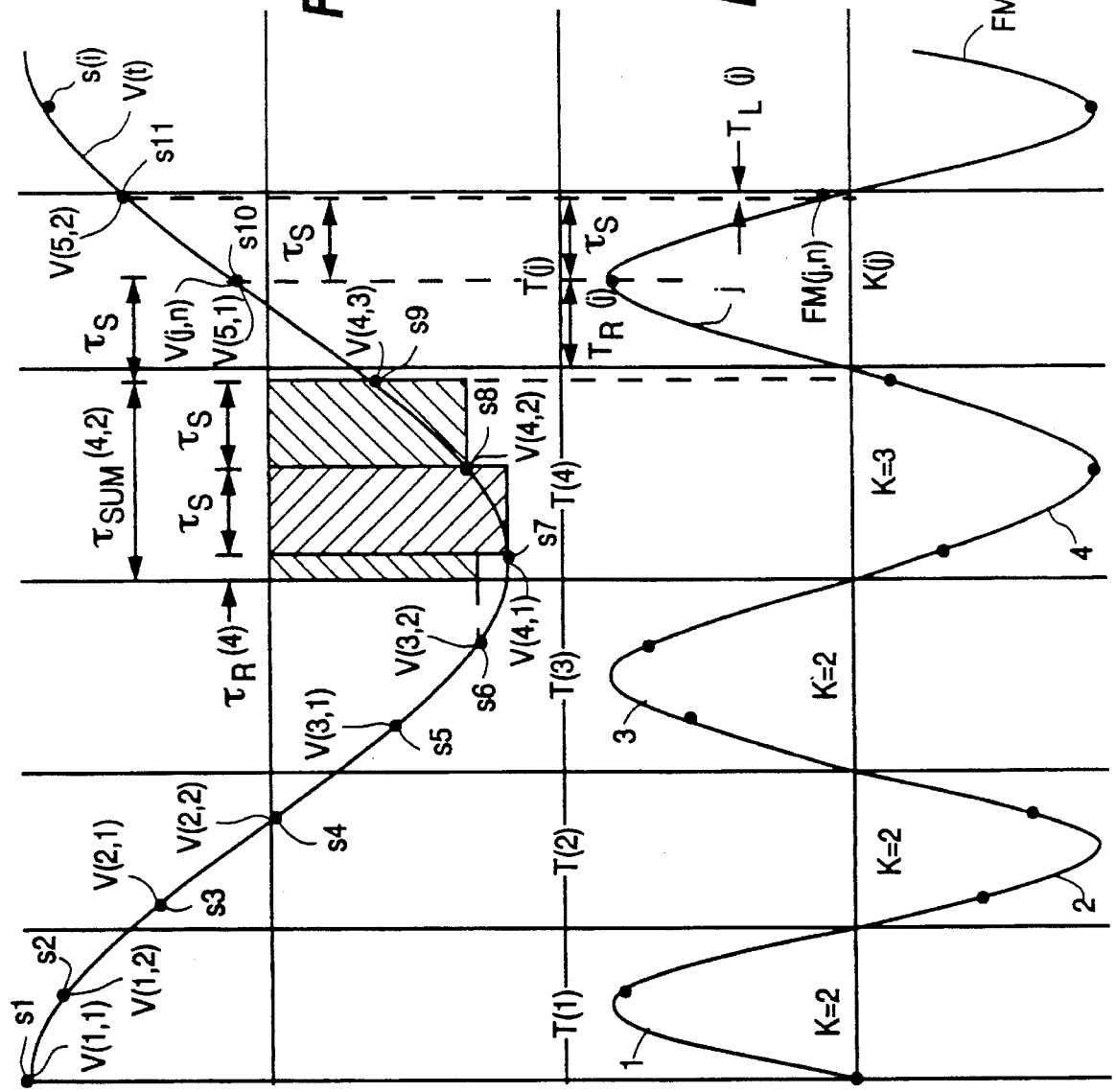
FIGS. 1a and 1b illustrate exemplary waveforms of a modulating input signal and a corresponding modulated output signal, respectively, including representative digital samples in both signals, derived in accordance with inventive aspects.

The solid line waveform of FIG. 1a illustrates the waveform of an exemplary video signal, V(t), such as a luminance signal, that is to be FM modulated onto a carrier prior to recording. The solid line waveform of FIG. 1b illustrates the resultant FM modulated signal, FM(t).

A digital synthesizing technique according to the invention may be used to generate FM(t) from V(t). The synthesis method interprets the FM signal as a pulse duration modulated signal. That is to say, the FM output signal of FIG. 1b may be considered as a pulse sequence. 1,2,3, j . . . , each pulse having a period, T(j), that is determined by the modulating video signal V(t), and by the various FM system parameters such as carrier frequency, CAR, and deviation. DEV. Additionally, the signal may be considered a bipolar one, in the sense that the pulses alternate in polarity.

To ascertain the value of each pulse period T(j) using a closed form equation is possible for only a few simple modulating signals. In general, the modulating video signal V(t) is much too complex for closed form expression.

Advantageously according to an inventive arrangement of a digital synthesizing technique, one need consider only the average frequency, $Freq_{AV}$, of FM(t) over an interval $\Delta t$. Taking Equation (2) into account, the average frequency. $Freq_{AV}$, may be defined as $$Freq_{AV} = CAR + DEV * V_{Av} \quad \text{Eq.(3)}$$

, where $$V_{AV} = \int_{\Delta t} \frac{V(t)}{t} \, dt \quad \text{Eq. (4)}$$

, i.e. V AV is the average value of the modulating video signal V(t) over the interval $\Delta t$.

Because the amplitude of the FM modulated output signal, FM(t), of FIG. 1b is constant, only the frequency, i.e. the time T(j) between zero crossings, is the variable of importance. For this reason, the smallest time interval, $\Delta t$, to consider in evaluating Equations (3) and (4), for any given pulse j, is,the corresponding pulse period T(j).

In accordance with an inventive feature, the calculation of the intervals T(j) is greatly simplified by providing discrete time samples. s(i)=s1, s2, s3 . . . of the modulating video signal V(t), having corresponding sampled values V1, V2, V3, . . . , as illustrated in FIG. 1a, The minimum rate. $1/\tau_S$, is determined by the Nyquist criterion in accordance with the highest frequencies of the video signal V(t) that are to be recorded, e.g. 3 megahertz in a VHS system. Advantageously, this rate, which establishes the sampling speed requirements of the analog-to-digital converter, may be significantly lower than the output sample rate of the FM modulated signal that is applied to the digital-to-analog converter.

Note that the number of samples, K(j), that occur within any given output pulse period T(j) varies as the frequency of the FM modulated signal FM(t) varies. Thus, as illustrated in FIGS. 1a and 1b, the number of samples in the pulse period T(2) is K(2)=2, while the number of samples in the interval T(4) is K(4)=3.

To calculate a given pulse period T(j) from the sampled values of the modulating video signal V(t), one may use Equations (3) and (4), to equate the reciprocal of the pulse period to twice the average frequency, $Freq_{AV}$, when averaged over that pulse period, i.e. when averaged over the time $\Delta t = T(j)$. Thus $$1/T(j) = 2 * Freq_{AV}(\Delta t = T(j)) \qquad \text{Eq. (5)}$$

By having available discrete samples of the modulating signal. The integral expression used in calculating the average modulating signal $V_{AV}$ of Equation (4) may be approximated by a piecewise summation over the interval $T(j)$. When this done, the average modulating signal may be taken as, $V_{AV\Sigma}(j)$, over the interval $T(j)$, resulting in $$1/T(j) = 2 * (CAR + DEV * V_{AV\Sigma}(j)) \qquad \text{Eq. (6)}$$

where $$V_{AV\Sigma(j)} = \frac{\tau_R(j)}{\tau_\Sigma(j)} * V(j-1, K(j-1)) + \frac{1}{\tau_\Sigma(j)} * \sum_{n=1}^{K(j)-1}(\tau_S * V(j,n)) + \frac{\tau_L(j)}{\tau_\Sigma(j)} * V(j, K(j)),$$

and $$\tau_\Sigma(j) = \tau_R(j) + \tau_S * (k(j)-1) + \tau_L(j) \qquad \text{Eq. (8);}$$

where, in accordance with the notations shown in FIGS. 1a and 1b, $V(j,n)$ = the n-th sampled value within a given pulse period $T(j)$, of the baseband modulating video signal $V(t)$, where n is a counter index, initially set equal to 1;

$K(j)$ = the number of samples in the output pulse period $T(j)$;

$\tau_R(j)$ = the residual time from the first (left-most) zero crossing point of the continuous-time FM modulated output signal $FM(t)$ of a given pulse period $T(j)$ to the time of the first sampled value, $V(j, n=1)$, of the modulating video signal within that period;

$\tau_L(j)$ = the time from the last sampled value, $V(j, K(j))$, of the modulating video signal within the period $T(j)$ to the second (right-most) zero crossing point of $FM(t)$ of that period;

$\tau_S$ = the sampling period of the baseband modulating video signal $V(t)$.

As an example, take the 4th pulse period $T(j=4)$ of FIGS. 1a and 1b. Four sampled values of video signal $V(t)$ are needed. Three of the sampled values, $V(4,1)$. $V(4,2)$, and $V(4,3)$, are found in the 4th interval, (K equals 3), and the remaining sampled value is the last sampled value of the previous pulse period, sample $V(3,2)$.

The average value $V_{AV\Sigma}$ of the modulating video signal in the 4th pulse period is computed in accordance with Equation (7):

$$V_{AV\Sigma}(4) = \frac{\tau_R(4)}{\tau_\Sigma(4)} * V(3,2) + \frac{\tau_S}{\tau_\Sigma(4)} * \qquad \text{Eq. (9)}$$
$$(V(4,1) + V(4,2)) + \frac{\tau_L(4)}{\tau_\Sigma(4)} * V(4,3)$$

A difficulty arises when one attempts to use Equations (6), (7) and (8) to calculate a sequence of output pulse periods $T(j)$ of FIG. 1b, given only the sequence of input samples $s(i)$ of the modulating, video signal $V(t)$ in FIG. 1a. To directly calculate a given pulse period $T(j)$ using these equations requires a priori knowledge of the end point of the period itself and a knowledge of the total number of samples $K(j)$ of $V(t)$ falling within that period.

To overcome this difficulty, an iterative process is used which maintains a running, average period, $t_{avg}(j,h)$, over the first h samples occurring in a given pulse j. Initially h is set to 1 at the beginning of the calculation of a given pulse period $T(j)$, and is then incremented by 1 to include another sample for use in another iteration when a new value of the running average period $t_{avg}(j,h)$ is calculated.

This procedure is repeated until the inclusion of another sampling interval $\tau_S$ results in the total time, $t_{sum} + \tau_S$, exceeding the running average period $t_{avg}(j,h)$, where $t_{sum}$ is calculated from the beginning-point zero crossing of the pulse to the time of the current input sample. This indicates that by adding an additional sample interval, the end-point zero crossing of the current pulse period has been exceeded. From this fact, one may conclude that the current value of the running average period, $t_{avg}(j,h)$, equals the pulse period $T(j)$, and that the total number of samples $K(j)$ in the pulse period equals the current value of h.

To calculate the running average period $t_{avg}(j,h)$, consider the fact that Equations (6), (7) and (8), are valid expressions (once certain variables are suitably redefined) for any number of samples h. Thus one obtains $$\frac{1}{2t_{avg}(j,h)} = CAR + \frac{DEV}{\tau_R(j) + (h-1)*\tau_S + \tau_L(j,h)} * \qquad \text{Eq. (10)}$$
$$\left\{ \tau_R(j) * V(j-1, K(j-1)) + \tau_S * \sum_{n=1}^{h-1} V(j,n) + \tau_L(j,h) * V(j,h) \right\}$$

where $\tau_R(j)$ = the residual time, if any, that is present from the last zero crossing of the continuous-time output signal to the first output sample point in the current output interval;

h = the remaining time in the current output interval;

h = a counter index number indicating the number of input samples of $V(t)$ found in the current output interval;

In order to simplify notation, introduce the running time variable $$\tau_{SUM}(j, h-1) = \tau_R(j) + (h-1)*\tau_S \qquad \text{Eq.(11),}$$

used to determine if enough discrete-time has passed to complete a full pulse period $T(j)$, and further introduce the variable $$V_{AVG}(j, h-1) = \frac{\tau_R(j) * V(j-1, K(j-1)) + \tau_S * \sum_{n=1}^{h-1} V(j,n)}{\tau_{SUM}(j, h-1)} \qquad \text{Eq. 12}$$

The variable $V_{AVG}(j, h-1)$ may be viewed as an average value of the modulating signal $V(t)$, averaged in time from the beginning of the pulse period to a point that ends at sample $h-1$, i.e. averaged in time over the time $\tau_{SUM}(j, h-1)$. This is illustrated in FIG. 1a, for the 4th pulse period that contains input samples s7, s8 and s89, preceded by the sample s6, the last sample of the previous pulse period.

Assume that the iterative process has proceeded to the point where $\tau_{SUM}$ and $V_{AVG}$ have been calculated using the samples through sample $h-1 = 2$, i.e., through the 2nd sample, sample s8. Based on Equation (11), the accumulated running time, $\tau_{SUM}(4,2)$, from the beginning of the 4th pulse interval to the 3rd sample s9, is equal to $\tau_R(4) + 2\tau_S$. The discrete-time average value $V_{AVG}(4,2)$ of the modulating signal averaged over the accumulated running time is the total of the 3 areas shown in hatching in FIG. 1a divide by $\tau_{SUM}$. The sample values used in the calculation includes the last sample, s6, in the previous pulse period, as well as the first two samples, s7 and s8, in the current period.

Once $V_{AVG}$ has been calculated, the running average period $\tau_{avg}(j,h)$ may be obtained in the following manner. Equation (10) may be rewritten as $$\frac{1}{2t_{avg}(j,h)} = CAR + \frac{DEV}{\tau_{SUM}(j,h-1) + \tau_L(j,h)} * \quad \text{Eq. (13)}$$

$$(\tau_{SUM}(j,h1) * V_{AVG}(j,h-1) + \tau_L(j,h) * V(j,h))$$

The discrete-time average value $V_{AVG}$ was calculated using a rectangular approximation of $V(t)$ between two actual sample points. Other approximations, such as a straight line connection between two sample points, may be used, at the possible expense of having a more complicated calculation algorithm.

It is important to note that a zero crossing of the output signal must occur when $\tau SUM > t_{avg}$. The instantaneous frequency is not known exactly until this condition is met. It is possible however to determine if a zero crossing should occur between two sample times $t=t_1$ and $t=t_1+\tau_S$ by evaluating $t_{avg}$ at $t=t_1$. For example, in FIGS. 1a and 1b, a zero crossing occurs between samples s9 and s10. To determine that such a zero crossing has occurred, it is necessary to note that $$\tau_L(j,h) = t_{avg}(-j,h) - \tau_{SUM}(j,h-1) \quad \text{Eq. (14)}$$

, resulting in $$t_{avg}(j,h) = \quad \text{Eq. (15)}$$

$$\frac{.5 + DEV * \{\tau_{SUM}(j,h-1) * (V(j,h) - V_{AVG}(j,h-1))\}}{CAR + DEV * V(j,h)}$$

Thus at any value of h, the values of $\tau_{SUM}(j,h-1)$, $V_{AVG}(j,h-1)$ and $t_{avg}(j,h)$ can be calculated from the sampled input, given that CAR and DEV are known numeric constants. It should be noted that there are no input sample values which can cause $t_{avg}(j,h)$ to be less than $\tau_R(j)+\tau_S$.

After $t_{avg}(j,h)$ is calculated, it is necessary to determine whether or not $t_{avg}(j,h) > \tau_R(j)+(h-1)\tau_S$. If it is greater, then a new value of $\tau_{SUM}$ and $V_{AVG}$ is calculated and h is incremented by 1.

If $\tau_{SUM}(j,h-1)+\tau S > t_{avg}(j,h)$, then it is necessary to store 3 values in an output memory queue. These are $t_{avg}(j,h)=T(j)$, h=K(j) and the residual time $\tau_R(j)$. These values are used in conjunction with a relatively small capacity sine ROM lookup table to calculate discrete-time values of the FM modulated output signal, as will be later described.

To calculate the next pulse period $T(j+1)$, it is necessary to calculate a new value of the residual time, $\tau_R(j+1)$, for the next output pulse, pulse j+1. The new value is $\tau_R(j+1) = \tau_{SUM}(j,h-1)+\tau_S-T(j)$. After the new value of $\tau_R(j+1)$ is calculated, h is reset to 1. However, if $\tau_R$ is ever 0, for example, if $\tau_R(j+1)=0$ then h is set to 2. After these data updating steps have been performed. The process of evaluating the next running average period $t_{avg}(j+1,h)$ is then initiated.

Figure 2:
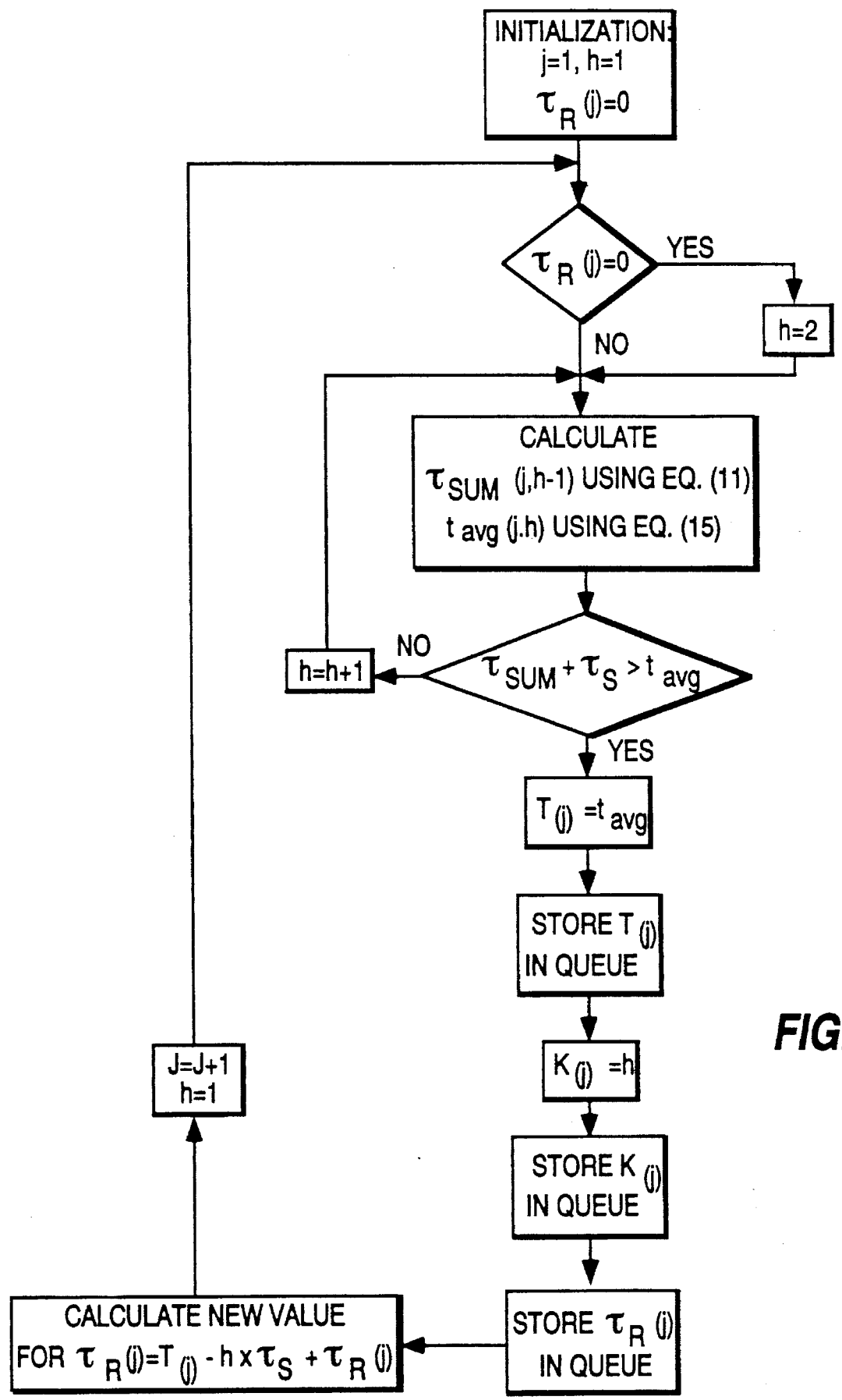
FIG. 2 illustrates a flowchart of an inventive method used to calculate the pulse periods of the FM modulated signal illustrated in FIG. 1b.

A flowchart describing the above procedure is given in FIG. 2. It should be noted that for initialization purposes the first output pulse, pulse j=1 of FIG. 1b, is arbitrarily chosen as a positive pulse and phased relative to the first input sample s1 so as to set the first residual time $\tau_R(j=1)=0$. Any subsequent residual time can then be determined once its preceding pulse period has been calculated.

Discrete-time values, $FM(j,n)$, of the FM modulated output signal, shown in FIG. 1b, may be calculated for each pulse j, based on the values of $T(j)$, $\tau_R(j)$ stored in the output memory queue. The equation for $FM(j,n)$ is $$FM(j,n) = -SGN(j) * \sin\left\{\frac{\pi}{T(j)} * (\tau_R(j) + (n-1) * \tau_S)\right\} \quad \text{Eq. (16)}$$

for n=1,2, ..., K(j), and where SGN(j) is the sign function, i.e. (−1) raised to the j-th power. The change in polarity of alternate output pulses introduced by the sign function is indicative of the quantization of the output signal.

The values of FM(j,n) are then supplied to a digital-to-analog converter for generating the continuous-time FM modulated output signal FM(t) of FIG. 1b.

It may be advantageous to operate the digital-to-analog converter in the modulator output stage at a faster rate, $1/\tau_{DA}$, than the rate, $\tau_S$, for which input samples s(i) are being generated. Equation (16) is then modified to the following $$FM(j,p) = -SGN(j) * \sin\left\{\frac{\pi}{T(j)} * (p * \tau_{DA} + \tau_0(j))\right\} \quad \text{Eq. (17)}$$

for p=0,1,2, .... The time $\tau_0(j)$ represents the residual time between the first zero crossing instant of the j-th output pulse and the occurrence of the first computed output sample FM(j,0) in that pulse period. For initialization purposes, the residual time $\tau_0(1)$ of the first pulse is set to 0.

Figure 3:
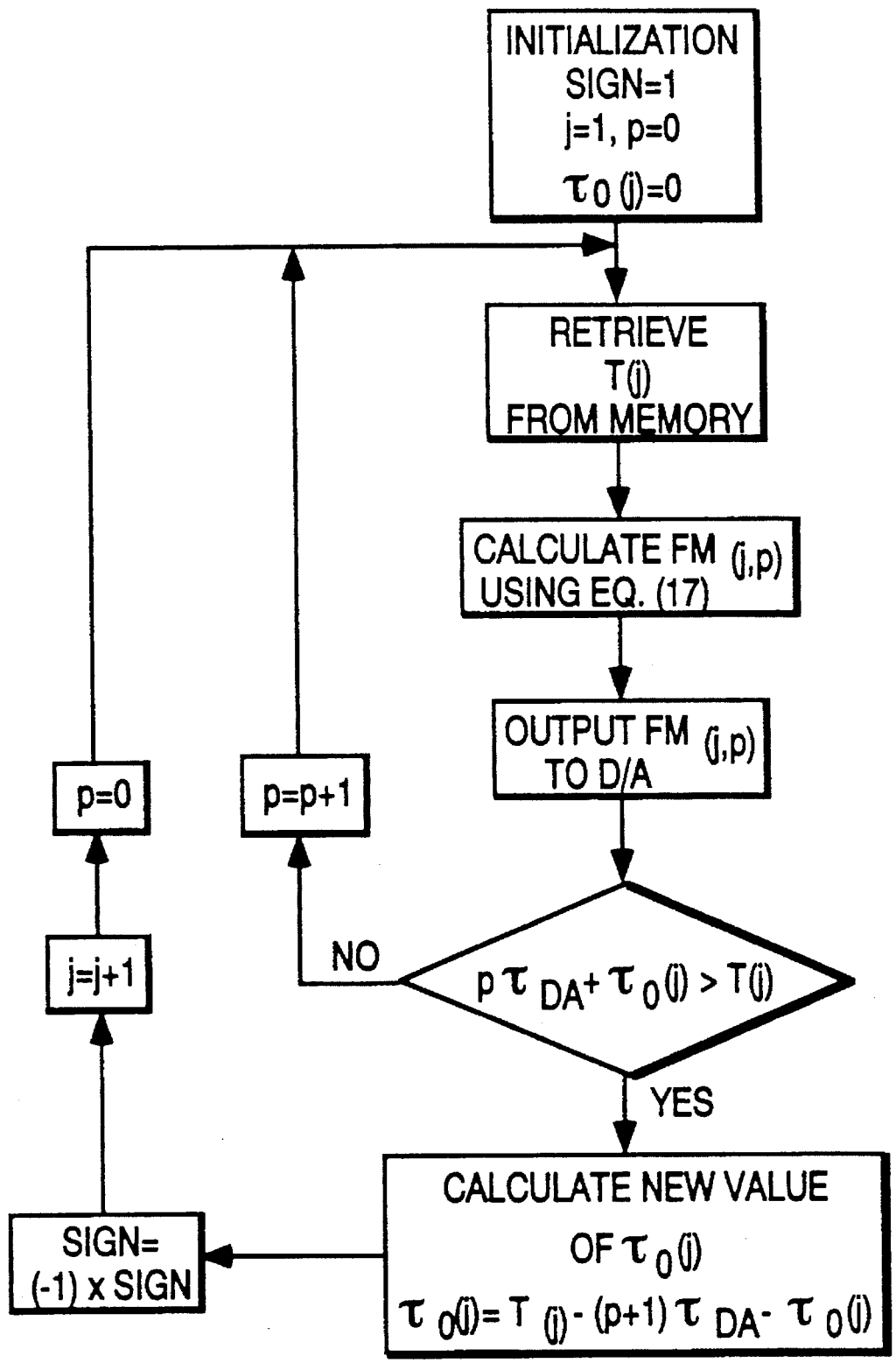
FIG. 3 illustrates a flowchart for calculating FM output samples from the calculated values of the FM signal pulse periods.

When the counter variable p has been incremented to the point where a new pulse period is being entered, a new value $T(j+1)$ for the next output pulse period is fetched from memory. The counter variable p is reset to 0 before beginning the calculation of a new sequence of output samples in the pulse period j+1. Storing in memory of the calculated values $\tau_R(j)$ and K(j) is unnecessary since they are not being used for the calculation of the output samples FM(j,p). A flowchart of the steps taken to calculate the sequence of output samples FM(j,p) is provided in FIG. 3.

The digital FM synthesizing technique just described, in accordance with various inventive aspects, may be used to record an input signal on a recording medium. For example, this technique may be used to record a luminance, chrominance, or composite video signal on video tape.

The circuit is compatible with all FM record standards (NTSC, PAL and SECAM for VHS or SVHS), with the only restriction being the sampling rate of the A/D and the conversion rate of the D/A. This greatly reduces the parts count external to the IC's in, e.g., a multistandard recorder.

Figure 4:
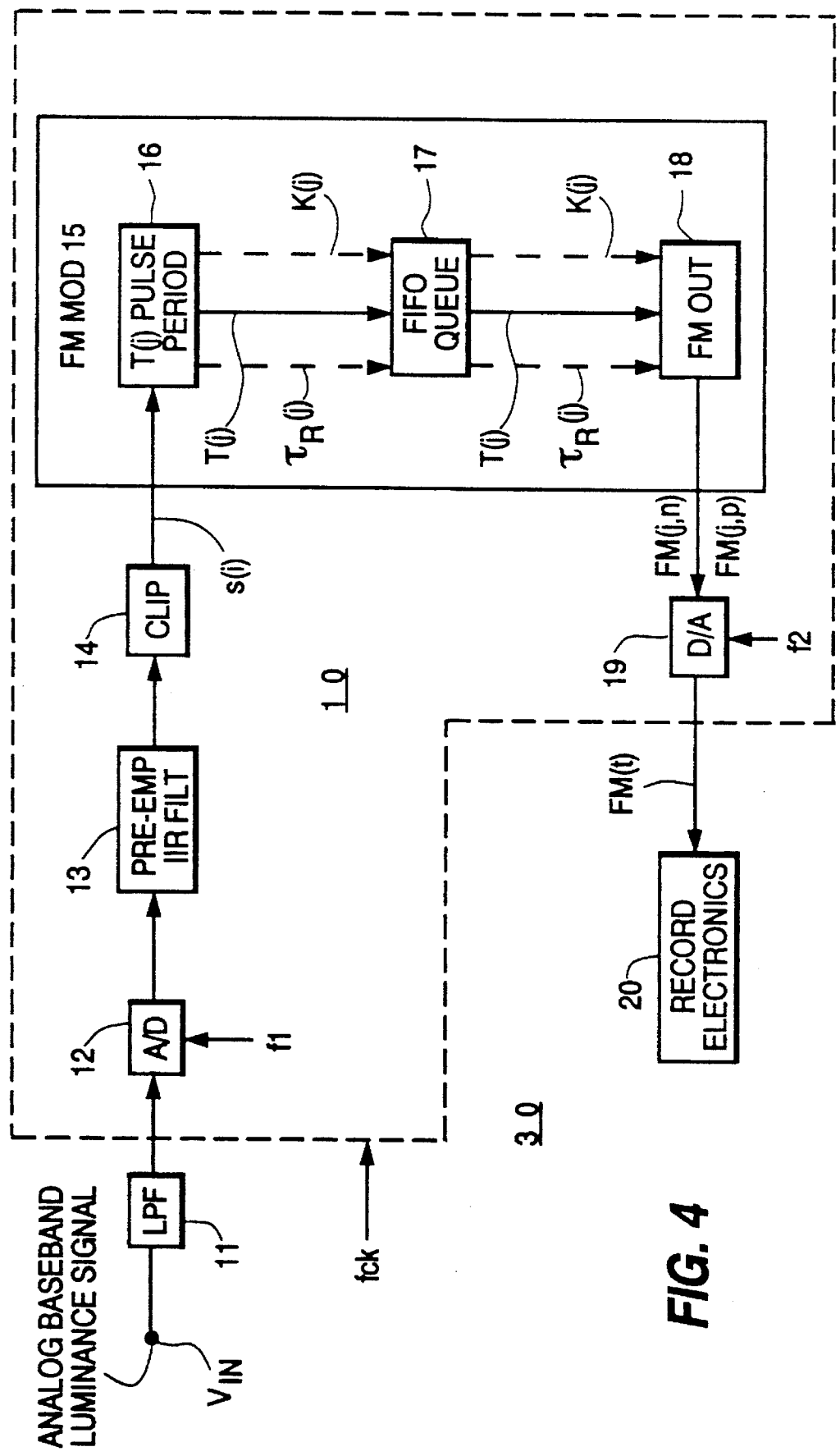
FIG. 4 illustrates in block diagram form an FM record system which incorporates an inventive digital FM synthesizer technique.

A block diagram of a VCR record system 30, including a digital FM synthesizer 10 embodying the invention, is shown in FIG. 4. The clock input to the digital part of the system, fck, is greater than 25 megahertz for PAL in the SVHS standard and is approximately 20 megahertz for PAL in the VHS standard. A low pass filter 11 may be used to eliminate frequencies in the input signal Vin above the Nyquist frequency of analog-to-digital converter, A/D 12 (10 megahertz). The A/D could actually operate at approximately 10 megahertz clock frequency, f1, for video applications without loss of signal fidelity. Input signal Vin may be, illustratively, an analog baseband luminance signal.

A pre-emphasis filter 13 receives the digitized input signal. The filter may be constructed as a standard Infinite Impulse Response or Finite Impulse Response digital filter which approximates the pre-emphasis function for the recording system being used (1.3 microsecond for PAL VHS).

The output of pre-emphasis filter 13 is applied to a clipping circuit 14, which is used to limit the minimum and maximum frequency of the output FM signal. This is easily implemented with a lookup table on the output data from the digital filter section. This assumes that video clamping and AGC are applied to the signal, by circuitry not shown, prior to filtering. Other conventional processing of the signal prior to entering the modulator stage are also omitted from the figure.

A digital FM modulator 15, embodying the invention, receives the digital samples s(i) from the output of clipping circuit 14 and generates digital FM output samples, FM(j,n)

or FM(j,p), calculated in accordance with the digital synthesizing techniques described above. The digital FM modulator stage is similar in concept to an IIR filter because it uses a group of time domain samples to calculate the output signal. This implies a fixed delay from the input to the output.

Modulator 15 is arranged in three stages. The first stage 16 receives the digital input samples s(i) and calculates the sequence of output pulse periods T(j) and the associated sequences for the residual times $\tau_R(j)$ and the sample counts K(j). The second stage 17, a memory stage, stores the values of T(j), $\tau_R(j)$ and K(j). These values are then fetched by the last stage 18, the FM modulator stage, to generate the sequence of digital FM modulated output samples FM(j,n).

Memory stage 17 functions as a first-in-first-out, FIFO, queue. The queue prevents the output calculator in FM modulator stage iS from running out of values of T(j), $\tau_R(j)$ and K(j) when the current output frequency is higher than the next, i.e. during a maximum white to maximum black transition. If modulator stage 18 calculates the output samples as samples FM(j,p), in accordance with the algorithm of the flowchart of FIG. 3, then memory stage 17 need store only the values of T(j).

A digital-to-analog converter, D/A 19, operating at an output clock rate f2, converts the FM output samples from modulator stage 18 into an analog signal FM(t). The FM signal is then sent to the VCR record electronics stage 20 for recording the signal on magnetic tape.

If the modulator stage operates at an output rate that is higher than the input sampling rate f1, e.g. at the D/A conversion rate f2, then the output rate must exceed $2*(CAR+f_{max}+DEV/2)$, where $f_{max}$ is the maximum frequency of the input modulating signal. There need be no direct relationship between the input sampling rate f2 and the FM output conversion rate. This permits the use of an existing clock that is available in the VCR, e.g. of a clock operating at 4Fsc=17.734476 megahertz, when processing a PAL video signal.

Because the input sampling rate and the output conversion rate need not be directly related, the calculations of the pulse periods T(j) may be performed at a comparatively low frequency (6–7 megahertz) while the output converter runs at a high frequency (4 times the input rate). This has two advantages. The more complex stage which calculates the pulse periods may be implemented with higher resolution in order to preserve signal accuracy and fidelity. The output sine table, adders and D/A's do not require as much accuracy due to the oversampling of the sine function. This reduces the complexity of the hardware required to implement the modulator.

The arrangements described above advantageously minimize calculation time, minimize the required memory space, and minimize the required analog bandwidth. Close tolerances are maintained on the carrier and deviation, to within the tolerances of the various clocks used by the system. Low input sampling rates and output D/A conversion rates are used, typically digital video rates. No external analog adjustments are required, resulting in minimal drift with aging, according to the clock drifts. Few unit-to-unit variations in pre-emphasis are found, and record format changes under software control is made possible.

What is claimed:

1. Apparatus, comprising:
    first means for providing a first plurality of digital samples representative of an input signal;
    second means coupled to said first means for generating a second plurality of digital samples which represents a corresponding plurality of pulse periods that defines a pulse duration modulated signal representing modulation of a carrier by said input signal; and
    third means responsive to said second plurality of digital samples for generating a third plurality of digital samples representing a modulated output signal corresponding to said pulse duration modulated signal.

2. The apparatus of claim 1 further comprising electronic recording means responsive to said third plurality of digital samples, for recording on a recording medium a signal representative of said output signal.

3. The apparatus of claim 2 wherein said recording medium is video tape.

4. The apparatus of claim 3 wherein said input signal includes luminance information.

5. The apparatus of claim 1 wherein said third means generates said third plurality of digital samples representing a sequence of output pulses having pulse widths corresponding to said pulse periods.

6. The apparatus of claim 5 wherein said sequence of output pulses is a sequence of pulses which alternate in polarity.

7. The apparatus of claim 1 wherein said third plurality of digital samples represents an FM carrier modulated output signal.

8. The apparatus of claim 7 wherein said third plurality of digital samples is a sequence of pulses which alternate in polarity.

9. The apparatus of claim 1 further including a digital-to-analog converter responsive to said third plurality of digital samples for generating said modulated output signal as an analog output signal.

10. The apparatus of claim 9 further including record electronics for recording said analog output signal on a recording medium.

11. The apparatus of claim 10 wherein said recording medium is video tape.

12. The apparatus of claim 11 wherein said input signal comprises a luminance signal.

13. The apparatus of claim 12 wherein said modulated output signal is a frequency modulated signal.

14. The apparatus of claim 9 wherein said input signal is an analog signal and said first means comprises an analog-to-digital converter responsive to said analog input signal for providing said first plurality of digital samples at an output thereof.

15. The apparatus of claim 14 wherein said analog-to-digital converter and said digital-to-analog converter have different sampling rates.

16. The apparatus of claim 14 wherein the sampling rate of said analog-to-digital converter is slower than the sampling rate of said digital-to-analog converter.

17. The apparatus of claim 1 including means for storing said plurality of pulse periods in a memory, said third means retrieving said stored plurality of pulse periods from said memory as needed, for calculation of the values of said third plurality of digital samples.

18. The apparatus of claim 1 wherein said plurality of pulse periods is a sequence of pulse periods T(j), j=1,2,3, . . . , that defines said pulse duration modulated signal representing FM modulation of a carrier by said input signal, in accordance with the equation:

$$1/T(j)=2*(CAR+DEV*V_{AVE}(j)$$

where $$V_{AV\Sigma(j)} = \frac{\tau_R(j)}{\tau_\Sigma(j)} * V(j-1, K(j-1)) + \frac{1}{\tau_\Sigma(j)} * \sum_{n=1}^{K(j)-1} (\tau_S * V(j,n)) + \frac{\tau_L(j)}{\tau_\Sigma(j)} * V(j, K(j)),$$

and $$\tau_\Sigma(j) = \tau_R(j) + \tau_S * (K(j)-1) + \tau_L(j);$$

where,

CAR=the FM carrier frequency;

DEV=the FM deviation;

V(j,n)=the $n^{th}$ one of said first plurality of digital samples within a given pulse period T(j), where n is a counter index, initially set equal to 1;

K(j)=the number of said first plurality of digital samples in the pulse period T(j);

$\tau_R(j)$=the residual time from the first zero crossing point of said pulse duration modulated signal of a given pulse period T(j) to the time of the first one V(j,n=1), of said first plurality of digital samples within that period;

$\tau_L(j)$=the time from the last one, V(j,K(j)), of said first plurality of digital samples within the period T(j) to the second zero crossing point of said pulse duration modulated signal within that period; and $\tau S$=the sampling period associated with said first plurality of digital samples.

19. The apparatus of claim 18 wherein said third means generates said third plurality of digital samples as a sequence of digital samples, FM(j,n), in accordance with the equation $$FM(j,n) = -SGN(j) * \sin\left\{ \frac{\pi}{T(j)} * (\tau_R(j) + (n-1) * \tau_S) \right\},$$

where SGN(j) is the sign function.

20. The apparatus of claim 19 including means for storing in a memory said sequence of pulse periods T(j), a sequence of corresponding values $\tau_R(j)$ and a sequence of corresponding values K(j), said third means retrieving the three stored sequences from said memory as needed, for calculation of the values of said third plurality of digital samples.

21. The apparatus of claim 1 wherein said plurality of pulse periods defines a sequence of pulse periods T(j), j=1,2,3, ... , that defines said pulse duration modulated signal representing FM modulation of a carrier by said input signal, to generate said third plurality of digital samples as a sequence of digital output samples FM(j,p), in accordance with the equation:

$$FM(j,p) = -SGN(j) * \sin\left\{ \frac{\pi}{T(j)} * (p * \tau_{DA} + \tau_0(j)) \right\},$$

p=0,1,2, ... , where $\tau_{DA}$=the sample interval between successive ones of said digital output samples, and $\tau 0(j)$=the residual time between the first zero crossing instant of an output pulse corresponding to the $j^{th}$ pulse period and the occurrence of the first computed output sample FM(j,O) in that pulse period.

22. The apparatus of claim 21 wherein the interval $\tau_{DA}$ is shorter than the sampling period associated with said first plurality of digital samples.

* * * * *